(12) United States Patent
Sawada et al.

(10) Patent No.: US 6,548,941 B2
(45) Date of Patent: Apr. 15, 2003

(54) PIEZOELECTRIC ELEMENT

(75) Inventors: Takuya Sawada, Lausanne (CH);
Masahiko Kimura, Kusatsu (JP);
Akira Ando, Omihachiman (JP)

(73) Assignee: Murata Manufacturing Co. LTD (JP)

( * ) Notice: Subject to any disclaimer, the term of this patent is extended or adjusted under 35 U.S.C. 154(b) by 0 days.

(21) Appl. No.: 10/188,974

(22) Filed: Jul. 3, 2002

(65) Prior Publication Data
US 2003/0020374 A1 Jan. 30, 2003

(30) Foreign Application Priority Data
Jul. 12, 2001 (JP) .......................... 2001-212747

(51) Int. Cl.⁷ .................... H01L 41/08; H01L 41/047
(52) U.S. Cl. .................... 310/363; 310/366; 310/363; 310/358
(58) Field of Search ................. 310/366, 363, 310/364, 365, 324, 368, 358

(56) References Cited

U.S. PATENT DOCUMENTS

| | | | | |
|---|---|---|---|---|
| 6,258,291 B1 | * | 7/2001 | Kimura et al. | 252/62.9 R |
| 6,369,488 B1 | * | 4/2002 | Ando et al. | 310/320 |
| 6,426,017 B2 | * | 7/2002 | Takahashi et al. | 252/62.9 R |
| 6,432,244 B1 | * | 8/2002 | Weder | 156/209 |

* cited by examiner

*Primary Examiner*—Nestor Ramirez
*Assistant Examiner*—Karen Addison
(74) *Attorney, Agent, or Firm*—Dickstein, Shapiro, Morin & Oshinsky, L.L.P.

(57) ABSTRACT

A piezoelectric element includes a plurality of piezoelectric layers which contain a bismuth layer compound as the main component of the piezoelectric ceramic composition. The piezoelectric layers are provided with electrodes containing Pd as a main component so that the piezoelectric layers vibrate. At least one of the electrodes and the piezoelectric ceramic composition contains Ag.

19 Claims, 2 Drawing Sheets

PIEZOELECTRIC ELEMENT

BACKGROUND OF THE INVENTION

1. Field of the Invention

The present invention relates to a piezoelectric element used for piezoelectric ceramic resonators, piezoelectric ceramic filters, or the like.

2. Description of the Related Art

Conventionally, piezoelectric ceramic compositions containing lead zirconate titanate ($Pb(Ti_xZr_{1-x})O_3$) or lead titanate ($PbTiO_3$) as a main component have widely been used for piezoelectric ceramic elements such as piezoelectric ceramic filters and piezoelectric resonators.

Since piezoelectric ceramic compositions containing lead zirconate titanate or lead titanate as a main component contain a large amount of lead, there is a problem in that the uniformity of the products deteriorate because of the vaporization of lead oxide in the manufacturing process.

In order to resolve the above problem, various piezoelectric ceramic compositions containing no lead or only a small amount of lead have been examined. Such piezoelectric ceramic compositions include materials containing a bismuth layer compound, such as strontium bismuth niobate ($SrBi_2Nb_2O_9$), as a main-component. Since piezoelectric ceramic compositions containing a bismuth layer compound as a main component contain no lead oxide, the above problem does not arise.

In piezoelectric ceramic elements, such as piezoelectric ceramic filters and piezoelectric ceramic resonators, comprising piezoelectric ceramic compositions containing lead zirconate titanate ($Pb(Ti_xZr_{1-x})O_3$) or lead titanate ($PbTiO_3$) as a main component, it has conventionally been known that piezoelectric elements having a layered structure including a plurality of piezoelectric layers and electrodes have high performance characteristics.

In piezoelectric ceramic elements comprising piezoelectric ceramic compositions containing lead zirconate titanate ($Pb(Ti_xZr_{1-x})O_3$) or lead titanate ($PbTiO_3$) as a main component, platinum (Pt), having a melting point of 1,770° C., and palladium (Pd), having a melting point of 1,550° C., which are resistant to transpiration at high firing temperatures, e.g. about 1,100° C., are usually used for the electrodes.

With respect to piezoelectric ceramic elements comprising piezoelectric ceramic compositions containing a bismuth layer compound as a main component, no examples of electrodes containing Pd as a main component were found by the inventors during their research.

Furthermore, the inventors have found that piezoelectric elements which have Pd electrodes and piezoelectric ceramic compositions containing a bismuth layer compound as a main component and which are prepared by firing cannot be made successfully. That is, the characteristics of the piezoelectric elements are not measurable, as shown in the following example.

It is reported in the Journal of the American Ceramics Society, vol. 75, p 2339 that a mixed powder of bismuth oxide and palladium oxide form a compound at a temperature higher than 500° C., and the compound has a melting point of at least 800° C.

The above report does not mention the reaction of a bismuth layer compound and metallic palladium but does mention the reaction of bismuth oxide and palladium oxide. However, it is not clear if the reason why piezoelectric elements which having Pd electrodes and piezoelectric ceramic compositions containing a bismuth layer compound as a main component and which are prepared by firing cannot be made successfully is the same as in the above report. There is a possibility that the firing of the untreated piezoelectric elements causes these unsatisfactory characteristics.

SUMMARY OF THE INVENTION

Accordingly, it is an object of the present invention to provide a piezoelectric element including Pd electrodes and a piezoelectric ceramic composition containing a bismuth layer compound as a main component in order to avoid the use of lead.

In order to solve the above problem, the piezoelectric element of the present invention includes a plurality of piezoelectric layers, each layer comprising a piezoelectric ceramic composition containing a bismuth layer compound and electrodes containing Pd. The piezoelectric layers are layered in the thickness direction of the piezoelectric element, the electrodes are provided to each of the piezoelectric layers, and at least one of the electrodes and the piezoelectric ceramic composition contain Ag.

In the above configuration, since Ag is contained in at least one of the piezoelectric ceramic composition and the electrodes, the diffusion of Pd contained in the electrodes into the piezoelectric ceramic composition and the reaction of Pd with the piezoelectric ceramic composition are inhibited, thus preventing the characteristics of the piezoelectric element from deteriorating when the piezoelectric ceramic composition containing a bismuth layer compound as a main component is used for the piezoelectric element.

In the above configuration, if m represents the weight of Ag contained in at least one of the electrodes and the piezoelectric ceramic composition and M represents the weight of Pd contained in the,electrodes, preferably the ratio of m to M is 0.1 m/M, and most preferably 0.1 n/M 10.

The piezoelectric ceramic composition preferably contains at least one compound selected from the group consisting of $Bi_2WO_6$, $CaBi_2Nb_2O_9$, $SrBi_2Nb_2O_9$, $BaBi_2Nb_2O_9$, $PbBi_2Nb_2O_9$, $CaBi_2Ta_2O_9$, $SrBi_2Ta_2O_9$, $BaBi_2Ta_2O_9$, $PbBi_2Ta_2O_9$, $Bi_3TiNbO_9$, $Bi_3TiTaO_9$, $Bi_4Ti_3O_{12}$, $SrBi_3Ti_2NbO_{12}$, $BaBi_3Ti_2NbO_{12}$, $PbBi_3Ti_2NbO_{12}$, $CaBi_4Ti_4O_{15}$, $SrBi_4Ti_4O_{15}$, $BaBi_4Ti_4O_{15}$, $PbBi_4Ti_4O_{15}$, $Na_{0.5}Bi_{4.5}Ti_4O15$, $K_{0.5}Bi_{4.5}Ti_4O_{15}$, $Ca_2Bi_4Ti_5O_{18}$, $Sr_2Bi_4Ti_5O_{18}$, $Ba_2Bi_4Ti_5O_{18}$, $Pb_2Bi_4Ti_5O_{18}$, $Bi_6Ti_3WO_{18}$, and the like, as a main component.

In the above configuration, since a bismuth layer compound is a main compound, a piezoelectric element such as a piezoelectric ceramic filter and a piezoelectric ceramic resonator, which contain no lead or a small amount of lead and are environmentally friendly, can be provided at a relatively low cost.

Japanese Unexamined Patent Application No. 12-007999 discloses that a piezoelectric ceramic composition containing a compound represented by formula $SrBi_2(Nb_{2-y}W_y)O_9$ can be adapted to materials for piezoelectric ceramic elements which are prepared by firing at a temperature lower than 1,100° C. and have a electromechanical coefficient of a practical level. Such a piezoelectric ceramic composition may be used for the above piezoelectric layers.

DESCRIPTION OF THE PREFERRED EMBODIMENTS

Examples of piezoelectric elements including a bismuth layer compound according to the present invention will now be described.

EXAMPLE $SrCO_3$, $Bi_2O_3$, $Nb_2O_3$, $WO_6$, and $MnCO_3$ are preferably used as starting materials and weighed to satisfy the formula $SrBi_2Nb_{1.8}W_{0.2}O_9+0.5$ wt % $MnCO_3$, wherein $SrBi_2Nb_{1.8}W_{0.2}O_9$ is a bismuth layer compound and wt % represents percentage by weight of $MnCO_3$ on the basis of the bismuth layer compound. The weighed starting materials are then mixed. The mixture B is then preferably calcined at 800–1,000° C. and formed into sheets having a substantially square shape by a doctor blade method.

Figure 2:
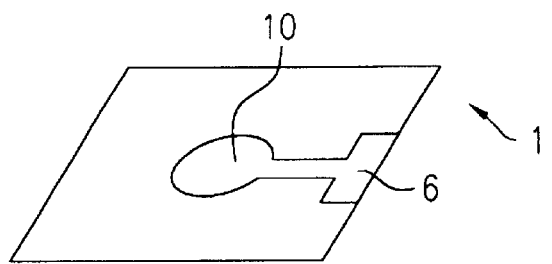
FIG. 2 is an exploded perspective view showing the manufacturing procedure of the above piezoelectric element.
Figure 2:
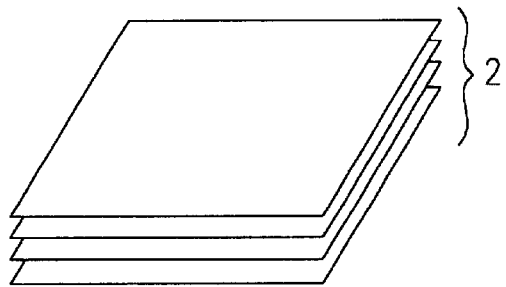
Figure 2:
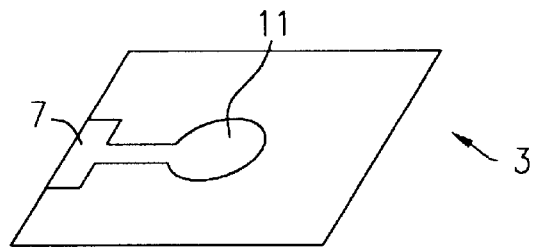
Figure 2:
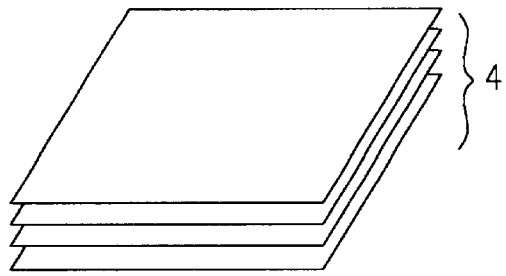
Figure 2:
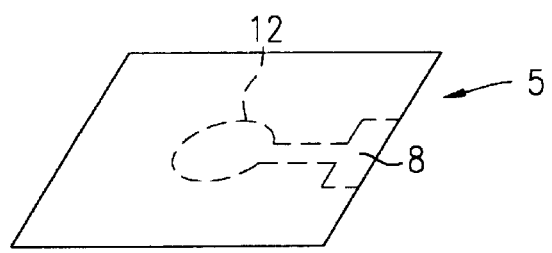

As shown in Table 1, pastes used for electrodes are preferably prepared such that the pastes contain Ag and Pd. The Ag contents are preferably 0 to 95% and are calculated according to formula Ag/(Ag+Pd) on the basis of weight percent. As shown in FIG. 2, using one of the pastes, an electrode having a diameter of 0.4–2.6 mm and a thickness of about 1 μm is formed at the center of each of the obtained sheets by printing to complete first, second and third electrode-provided sheets 1, 3 and 5, respectively, having first, second and third electrodes 10, 11 and 12 formed thereon, respectively.

In the first electrode-provided sheet 1, a first terminal 6 is formed on the top surface using the paste and extends from the first electrode 10 to a first side of the first electrode-provided sheet 1. In the second electrode-provided sheet 3, a second terminal 7 is formed using the paste and extends from the second electrode 11 to one side of the second electrode-provided sheet 3. Preferably, the second terminal 7 is positioned on the side opposite the first terminal 6. In the third electrode-provided sheet 5, a third terminal 8 is formed on the bottom surface of the sheet 5 using the paste and extends from the third electrode 12 to one side of the third electrode-provided sheet 5. Preferably, the third terminal 8 is positioned on the same side as the first terminal 6. The third terminal 8 and the third electrode 12 are preferably formed on the underside of the third electrode-provided sheet 5.

The first, second and third electrode-provided sheets 1, 3 and 5, and a plurality of first and second electrodeless sheets 2 and 4, are stacked in a thickness direction such that each of the centers of the first, second and third electrodes 10, 11 and 12 are aligned. For example, the second electrode-provided sheet 3 are preferably disposed between the first and second electrodeless sheets 2 and 4, and the first and second electrodeless sheets 2 and 4 are disposed between the first and third electrode-provided sheets 1 and 5. The stacked sheets are preferably pressed with a force of 200 MPa and then fired at 1,000–1,200° C. for 1–5 hours to obtain a compact, fired element.

Figure 1:
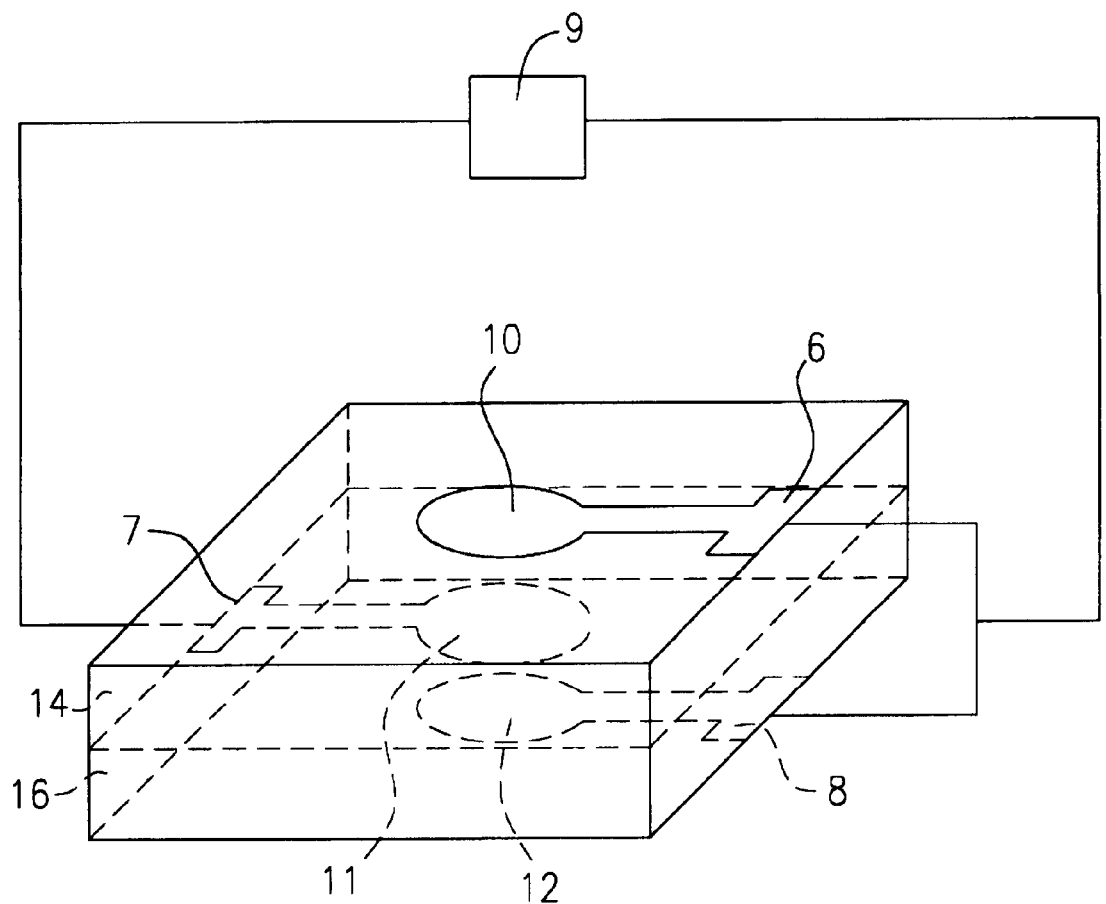
FIG. 1 is a perspective view of a piezoelectric element according to the present invention.

As shown in FIG. 1, the fired element is then polarized in the thickness direction, that is, the direction from the third electrode 12 to the first electrode 10, so as to obtain a piezoelectric element.

In the above piezoelectric element, a first piezoelectric layer 14 has the first electrode-provided sheet 1 and the plurality of first electrodeless sheets 2 and a second piezoelectric layer 16 has the second and third electrode-provided sheets 3 and 5 and the plurality of second electrodeless sheets 4. The first and second piezoelectric layers 14 and 16 are layered in the thickness direction to form a piezoelectric element comprising a piezoelectric ceramic composition containing a bismuth layer compound as a main component. The piezoelectric element preferably has a rectangular shape and a thickness of, for example, 0.4 mm.

Each of the centers of the first, second and third electrodes 10, 11 and 12, and the first and second piezoelectric layers 14 and 16, are preferably aligned. The first electrode 10 is preferably disposed on the exposed surface of the first piezoelectric layer 14. The second electrode 11 is preferably disposed on the upper surface of second piezoelectric layer 16, and the upper surface of second piezoelectric layer 14 is adhered to the underside surface of the first piezoelectric layer 14. The third electrode 12 is preferably disposed on the exposed surface of the second piezoelectric layer 16.

In the piezoelectric element, the number of first electrodeless sheets 2 disposed between the first and second electrode-provided sheets 1 and 3 can be varied to adjust the distance between the first and second electrode-provided sheets 1 and 3. Similarly, the number of second electrodeless sheets 4 disposed between the second and third electrode-provided sheets 3 and 5 can also be varied. Thus, the piezoelectric element can function as a piezoelectric filter or a piezoelectric resonator by using a harmonic vibration in the thickness direction between the first electrode 10 to the third electrode 12.

Since the piezoelectric element has a layered structure, the range of use can be greatly increased. That is, a bismuth layer compound generally has a Poisson ratio of 1/3, and piezoelectric elements functioning as piezoelectric filters or piezoelectric resonators containing a bismuth layer compound have some limitations (energy cannot be confined when using a fundamental wave in a thickness longitudinal vibration). However, if the piezoelectric elements have a layered structure, these limitations can be overcome, thus increasing the range of use to which they can be applied.

In the above piezoelectric element, the first, second and third terminals 6, 7 and 8 are preferably electrically connected to a power source or an impedance analyzer 9 so as to apply the same voltage to the first and third terminals 6 and 8 and to apply a different voltage to the second terminal 7, thereby generating a piezoelectric vibration. The impedance analyzer 9 is preferably used for applying driving signals to the first, second and third terminals 6, 7 and 8.

For various piezoelectric elements, Table 1 shows the Ag content of the pastes, the m/M ratio, the electromechanical coefficient k, and the top-to-valley ratio (resonance impedance/anti-resonance impedance). The electromechanical coefficient k was measured by method 6003 in Standard EMAS6100 of the Electronic Materials Manufacturers Association of Japan. The contents of Ag and Pd were measured by WDX (wavelength dispersive X-ray microanalysis) and ICP (inductively coupled plasma emission spectrometry).

Table 1, Sample 1 is outside the scope of the present invention. Ag represents the Ag content in the pastes and is calculated according to formula Ag/(Ag+Pd) on the basis of weight percent. In the m/M ratio, m represents the weight of Ag contained in at least one of the electrodes and the piezoelectric ceramic composition, and M represents the weight of Pd contained in the electrodes after firing. The top-to-valley ratio indicates the ratio of the resonance impedance to the anti-resonace impedance.

As shown in Table 1, it is clear that Samples 2–9 according to the present invention have an electromechanical coefficient k and a top-to-valley ratio of a practical level. Since the m/M ratio decreases as the Ag content is increased, it is presumed that a certain amount of Ag transpires and diffuses into the first piezoelectric layer 14 and the second piezoelectric layer 16.

The present invention is not limited to the above examples and is also effective for use in a piezoelectric element comprising piezoelectric layers prepared by firing.

TABLE 1

| Samples | Ag (wt %) | m/M Ratio (—) | k (%) | Top-to-Valley Ratio (dB) |
|---------|-----------|----------------|-------|--------------------------|
| 1*      | 0         | 0.000          | Not Measurable | Not Measurable    |
| 2       | 5         | 0.05           | 15    | 45                       |
| 3       | 10        | 0.1            | 15    | 55                       |
| 4       | 30        | 0.43           | 15    | 55                       |
| 5       | 50        | 1.0            | 15    | 60                       |
| 6       | 70        | 2.33           | 17    | 63                       |
| 7       | 80        | 4.0            | 16    | 60                       |
| 8       | 90        | 10.0           | 15    | 60                       |
| 9       | 95        | 12.0           | 12    | 55                       |

What is claimed is:

1. A piezoelectric element comprising:
   a first piezoelectric layer;
   a second piezoelectric layer positioned beneath the first piezoelectric layer;
   a third piezoelectric layer positioned between the first and second piezoelectric layers;
   a first electrode containing Pd provided on a surface of the first piezoelectric layer; and
   a second electrode containing Pd provided on a surface of the second piezoelectric layer,
   wherein the first and second piezoelectric layers are formed from a piezoelectric ceramic composition containing a bismuth layer compound, and at least one of the first and second electrodes and the piezoelectric ceramic composition contain Ag.

2. The piezoelectric element according to claim 1, wherein the ratio of the weight of Ag contained in the at least one of the first and second electrodes and the piezoelectric ceramic composition to the weight of Pd contained in the first and second electrodes is greater than or equal to 0.1.

3. The piezoelectric element according to claim 2, wherein the ratio of the weight of Ag contained in the at least one of the first and second electrodes and the piezoelectric ceramic composition to the weight of Pd contained in the first and second electrodes is greater than or equal to 0.1 and less than or equal to 10.

4. The piezoelectric element according to claim 1, wherein the third piezoelectric layer includes a plurality of piezoelectric layers.

5. The piezoelectric element according to claim 1, wherein the bismuth layer compound is $SrBi_2Nb_{1.8}W_{0.2}O_9$.

6. The piezoelectric element according to claim 1, wherein the at least one of the first and second electrodes and the piezoelectric ceramic composition contain Ag in an amount of about 5 to about 95% by weight.

7. The piezoelectric element according to claim 1, wherein the first and second electrodes have a diameter of about 0.4–2.6 mm and a thickness of about 1 $\mu$m.

8. The piezoelectric element according to claim 1, wherein the first and second electrodes are formed at the center the first and second piezoelectric layers, respectively.

9. The piezoelectric element according to claim 1, further comprising:
   a first terminal electrically connected to the first electrode, the first terminal located at a side of the first piezoelectric layer; and
   a second terminal electrically connected to the second electrode, the second terminal located at a side of the second piezoelectric layer opposite the first terminal.

10. The piezoelectric element according to claim 1, further comprising:
    a fourth piezoelectric layer positioned beneath the second piezoelectric layer;
    a fifth piezoelectric layer positioned between the second and fourth piezoelectric layers; and
    a third electrode containing Pd provided on a surface of the fourth piezoelecric layer,
    wherein the fourth and fifth piezoelectric layers are formed from a piezoelectric ceramic composition containing a bismuth layer compound, and at least one of the first, second and third electrodes and the piezoelectric ceramic composition contain Ag.

11. The piezoelectric element according to claim 10, wherein the third and fifth piezoelectric layers each include a plurality of piezoelectric layers.

12. The piezoelectric element according to claim 10, further comprising:
    a first terminal electrically connected to the first electrode, the first terminal located at a side of the first piezoelectric layer;
    a second terminal electrically connected to the second electrode, the second terminal located at a side of the second piezoelectric layer opposite the first terminal; and
    a third terminal electrically connected to the third electrode, the third electrode located at a side of the third piezoelectric layer opposite the second terminal.

13. The piezoelectric element according to claim 12, wherein the piezoelectric element utilizes a harmonic vibration between the first, second and third electrodes to function as a one of a piezoelectric filter and a piezoelectric resonator.

14. A piezoelectric electrode layer for a piezoelectric element, the piezoelectric electrode layer comprising:
    a piezoelectric sheet formed from a piezoelectric ceramic composition containing a bismuth layer compound; and
    an electrode containing Pd provided on the piezoelectric sheet, wherein at least one of the electrode and the piezoelectric ceramic composition contain Ag.

15. The piezoelectric electrode layer according to claim 14, wherein the ratio of the weight of Ag contained in the at least one of the electrode and the piezoelectric ceramic composition to the weight of Pd contained in the electrode is greater than or equal to 0.1.

16. The piezoelectric electrode layer according to claim 15, wherein the ratio of the weight of Ag contained in the at least one of the electrode and the piezoelectric ceramic composition to the weight of Pd contained in the electrode is greater than or equal to 0.1 and less than or equal to 10.

17. The piezoelectric electrode layer according to claim 14, wherein the bismuth layer compound is $SrBi_2Nb_{1.8}W_{0.2}O_9$.

18. The piezoelectric electrode layer according to claim 14, wherein the at least one of the electrode and the piezoelectric ceramic composition contain Ag in an amount of about 5 to about 95% by weight.

19. The piezoelectric electrode layer according to claim 14, wherein the electrode has a diameter of about 0.4–2.6 mm and a thickness of about 1 $\mu$m.

* * * * *